United States Patent
Holtvoeth et al.

[19]

[11] Patent Number: 6,075,979
[45] Date of Patent: *Jun. 13, 2000

[54] RADIO RECEIVERS

[75] Inventors: Knud Holtvoeth; Andreas Wichern, both of Hamburg; Wilfried Knop, Appen, all of Germany

[73] Assignee: U.S. Philips Corporation, New York, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/810,899

[22] Filed: Mar. 5, 1997

[30] Foreign Application Priority Data

Mar. 20, 1996 [EP] European Pat. Off. .............. 96301920

[51] Int. Cl.[7] ........................................ H04B 1/06
[52] U.S. Cl. ............................... 455/264; 455/318
[58] Field of Search ................... 455/131, 150.1, 455/190.1, 192.2, 182.2, 197.1, 313, 255, 256, 257, 264, 318; 331/175, 176, 177 R, 177 V, 198

[56] References Cited

U.S. PATENT DOCUMENTS 4,893,097  1/1990  Zwack ....................................... 331/176
5,335,364  8/1994  Heinonen ................................. 455/264
5,649,320  7/1997  Korhonen et al. ...................... 455/316
5,691,666  11/1997 Owen ....................................... 455/316
5,731,742  3/1998  Wojewoda et al. .................... 455/264
5,740,525  4/1998  Spears ..................................... 455/264
5,774,800  6/1998  Mori ........................................ 455/255

FOREIGN PATENT DOCUMENTS

0401919B1  8/1994  European Pat. Off. .......... H03L 1/02

Primary Examiner—Reinhard J. Eisenzopf
Assistant Examiner—Marsha D. Banks-Harold
Attorney, Agent, or Firm—Jack D. Slobod

[57] ABSTRACT

A receiver has a crystal oscillator (10) whose frequency can be adjusted in response to temperature compensation (TC) and automatic frequency control (afc) signals. The TC and afc signals are summed and applied to an op-amp (70) having a fixed gain functioning as a current to voltage converter. An output of the op-amp (70) is applied to the crystal oscillator (10). If the receiver is switched—on and—off in accordance with say a time division protocol, the output of the op-amp (70) is applied by way of a switch (72) to a storage circuit (30,C) which when the switch is open applies a bias voltage on the crystal oscillator (10) to maintain its output frequency.

14 Claims, 3 Drawing Sheets

RADIO RECEIVERS

BACKGROUND OF THE INVENTION

The present invention relates to a radio receiver (or a receiver section of a transceiver) having a temperature controlled crystal oscillator (TCXO) whose frequency may be further adjusted by an automatic frequency control (afc) circuit. A particular but not exclusive example of a radio receiver is a digital wide area pager which is operated in accordance with a time division protocol, such as the CCIR Radiopaging Code No. 1 (alternatively known as POCSAG).

A TCXO includes a tunable element, such as a varactor, to pull or adjust the output frequency so that it remains substantially constant in spite of the effects of temperature variation on the stability of the oscillator. If the radio receiver includes an afc circuit then its output is also coupled to the varactor. In order to maintain frequency stability in time division operation, the varactor control voltage must be held in a storage device, such as a capacitor, or generated as quickly as possible to ensure frequency stability. The temperature compensation voltage produced by say a thermistor is available substantially instantly but the afc loop has to start to generate an afc voltage which incurs a time delay.

FIG. 1 of the accompanying drawings shows one arrangement for simultaneously applying temperature compensation and afc voltages which have been generated in an integrated radio receiver circuit and are supplied to an off-chip TCXO 10 such as described in European Patent Specification EP-B1-0401919. An on-chip current source 12 representing the temperature compensating current is supplied to an inverting input 13 of a first op-amp 16 which is functioning as a current to current converter. An output 15 of the first op-amp 16 is connected by way of a switch 17 to a pin P4. The pin P4 is connected to one side of an off-chip capacitor C, the other side of which is coupled to an input of the TCXO 10. The output 15 of the op-amp 16 is coupled back to the inverting input 13 by an off-chip resistor 18 connected between the pin P4 and a pin P3 which is connected to the input 13. An off-chip bias setting resistor 20 for the TCXO's varactor is connected by way of a pin P5 to a non-inverting input 14 of the op-amp 16.

An on-chip afc current source 22 is connected to an inverting input 23 of a second op-amp 26 which is functioning as a current to current converter. A non-inverting input 24 of the op-amp 26 is connected on-chip to the output 15 of the op-3mp 16 to provide an offset for the afc. An output 25 of the op-amp 26 is fed back to the input 23 by way of an on-chip switch 27 and an off-chip resistor 28 which is connected to pins P1 and P2. A further resistor 30 is connected between the pin P1 and the input of the TCXO 10.

The resistor 18 serves to match the temperature compensation current, which is always present, to the afc current. The resistor 28 is provided to adjust the current to voltage rate. The combination of the resistor 30 and the capacitor C serve to hold the varactor bias when the switches 17 and 27 are open (or non-conductive) and thereby prevent the TCXO 10 from de-tuning.

Drawbacks to this known circuit when it is implemented as an integrated circuit are that it requires 5 pins, the switches 17 and 27 are sources of leakage currents, the op-amps 16 and 26 have to be compatible and when the outputs of the op-amps go high, the capacitor C is floating which makes it susceptible to noise from other sources.

OBJECTS AND SUMMARY OF THE INVENTION

An object of the present invention is to overcome these drawbacks.

According to the present invention there is provided a receiver including a crystal oscillator circuit including means responsive to external signals for tuning the oscillator circuit, means for generating temperature compensating and automatic frequency control signals, means for summing the temperature compensating and automatic frequency control signals and applying the sum signal to a current to voltage conversion means whose output is coupled to the oscillator circuit.

The present invention further provides an integrated receiver comprising a frequency down conversion stage having a first input for a received signal, a second input for a local oscillator signal and an output, wherein the local oscillator is a crystal controlled oscillator having means for adjusting the frequency of the oscillator in response to externally applied signals, a summing node having inputs for said externally applied signals and an output, current to voltage conversion means having an input coupled to the output of the summing node and an output coupled to the means for adjusting of the oscillator frequency.

By the receiver in accordance with the present invention comprising a single current to voltage conversion means, for example an op-amp having a fixed gain, the problem of compatibility and the need to provide chip area and extra current for a second op-amp is avoided.

In the case of coupling an integrated receiver to an off-chip TCXO, one less pin is required compared to the known circuit shown in FIG. 1 because of there only being one op-amp. As is realised by integrated circuit designers the saving of one pin is beneficial.

BRIEF DESCRIPTION OF THE DRAWING

The present invention will now be described, by way of example, with reference to the accompanying drawings, wherein.

In the drawings the same reference numerals have been used to indicate corresponding features.

DETAILED DESCRIPTION OF THE PREFERRED EMBODIMENT

Figure 2:
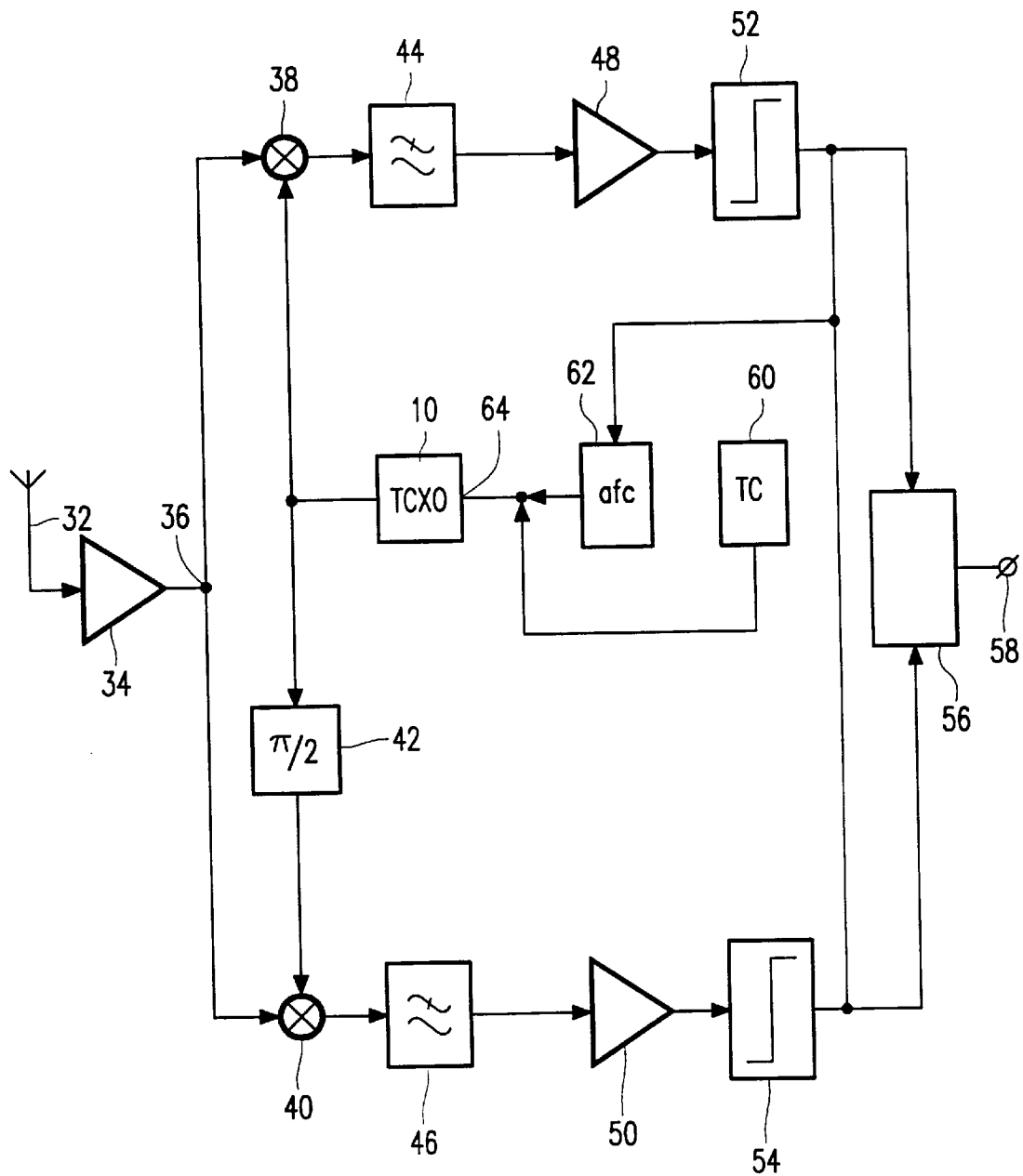
FIG. 2 is a block schematic diagram of a zero IF receiver.

Referring to FIG. 2, the zero IF receiver comprises an antenna 32 which is coupled to an rf amplifier 34. An output of the rf amplifier 34 is applied to a signal splitting node 36, the outputs of which are applied to first inputs of quadrature related mixers 38, 40. A TCXO 10 is coupled to a second input of the mixer 38 and by way of a 90 degree phase shifter 42 to a second input of the mixer 40. The products of mixing from the mixers 38, 40 are applied to respective low pass filters 44, 46 which select the zero IF components. Post mixer amplifiers 48, 50 are coupled to outputs of the filters 44, 46. Inputs of amplitude limiters 52, 54 are coupled to respective outputs of the amplifiers 48, 50. Outputs of the limiters 52, 54 are coupled to a demodulator 56 which produces data signals on an output terminal 58.

A temperature sensor 60, such as a thermistor, is coupled to an input 64 of the TCXO 10. An afc circuit 62 has an input coupled to receive the combined outputs of the limiters 52, 54 and an output coupled also to the TCXO input 64. Apart from the antenna 32 and the TCXO 10, which may not be fabricated as an integrated circuit, the remainder of the receiver may be fabricated as one or more integrated circuits.

The method of applying the temperature compensation and afc signals to the TCXO 10 shown in FIG. 3 will now be described. The temperature compensation signal from the current source 12 is applied together with the afc signal, represented by a current source 22, to a summing node 66. A bias current source 68 is summed with the output from the node 66 at an input of a current to voltage converter comprising, in the illustrated embodiment, a single op-amp 70 having a fixed gain. A switch 72 couples an output of the op-amp 70 to an off-chip resistor 30 which in turn is coupled to a capacitor C and to a frequency control input 64 of the TCXO 10.

A resistor 28 is coupled by way of a pin P1 to the afc current source 22 and serves to match the relatively fine current changes due to afc to the relatively coarse changes in the temperature compensation current source 12. A resistor 76 is coupled by way of a pin P2 to the input of the op-amp 70. The resistor 76 sets the gain of the summing node 66 in respect of the temperature compensation currents. By way of explanation the temperature compensation current is selected to choose the desired compensation characteristic in respect of temperature, for example to compensate the TCXO 10 to within say 4 to 5 kHz and the resistor 28 is selected to produce a finer control of the TCXO frequency to within say 1 kHz of the desired frequency.

A bias resistor 20 is coupled by way of a pin P4 to adjust a bias current source 68 to set the offset of the op-amp 70.

In operation, when the receiver is switched-on, that is powered-up in accordance with the prevailing battery conservation protocol, the switch 72 is closed and the sum of the temperature compensation and afc currents is applied to the TCXO 10 to control its frequency. However when the receiver is to be de-energised as required by the protocol, the switch 72 is opened and the capacitor C stores the previously applied compensating voltage so that the TCXO 10 frequency is maintained.

Figure 1:
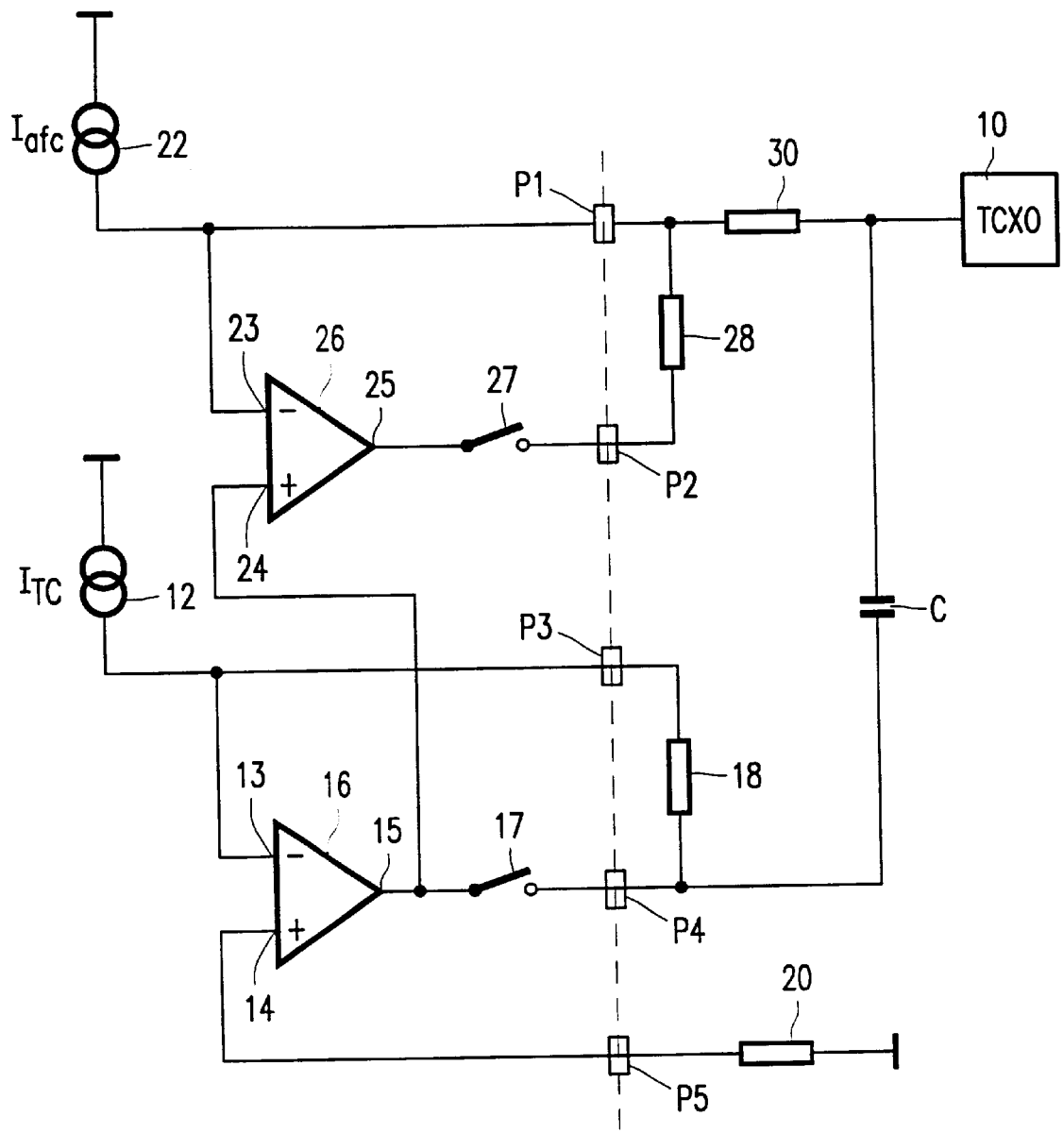
FIG. 1 is a block schematic diagram of a known method of applying temperature compensation and afc to a TCXO.
Figure 3:
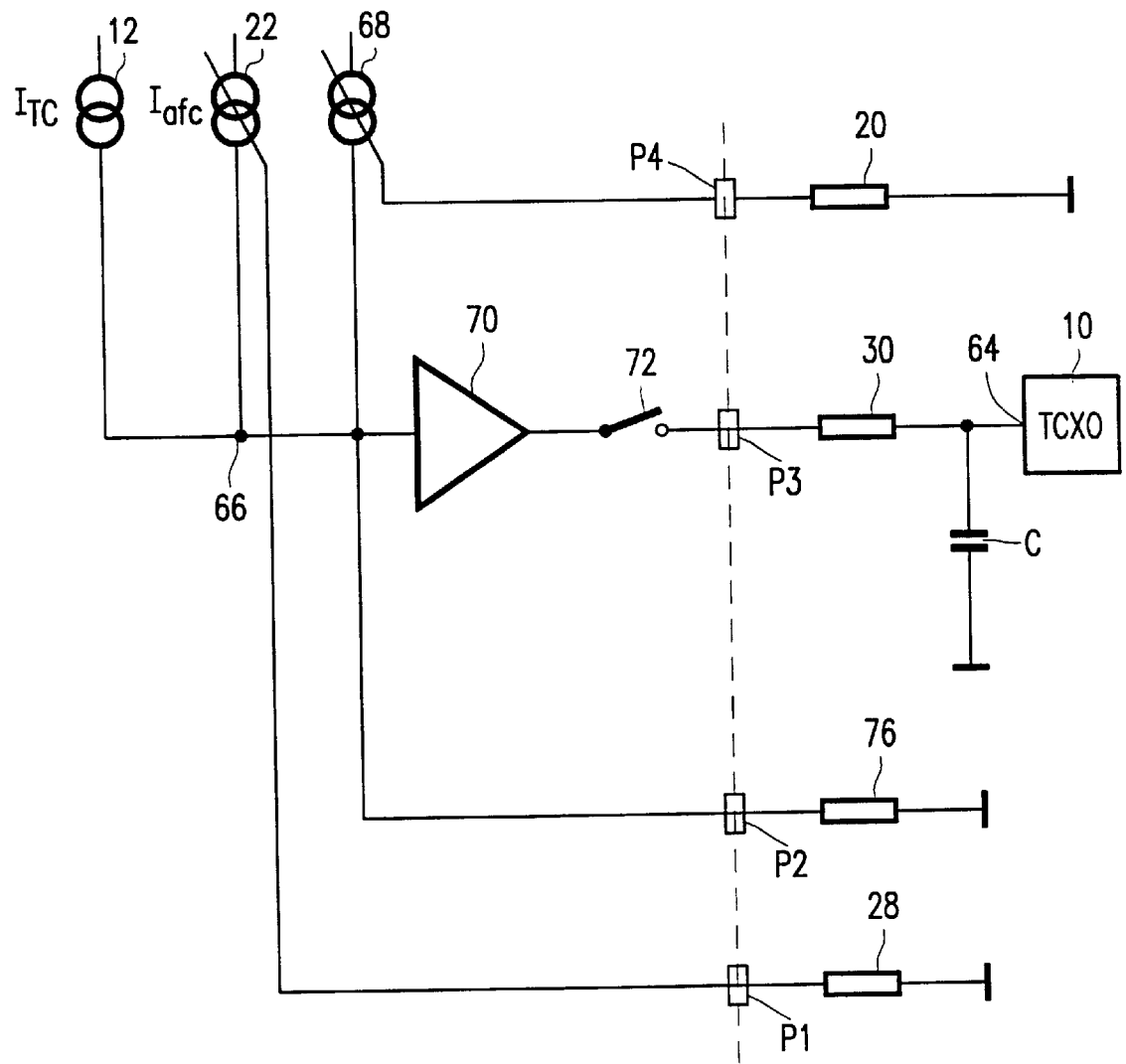
FIG. 3 is a block schematic diagram of a method of applying temperature compensation and afc to a TCXO in the receiver shown in FIG. 2.

Compared to the arrangement shown in FIG. 1, that shown in FIG. 3 requires one less pin, which is of importance to integrated circuit designers, and only uses one op-amp and one switch which not only saves chip area but also current.

From reading the present disclosure, other modifications will be apparent to persons skilled in the art. Such modifications may involve other features which are already known in the design, manufacture and use of radio receivers and component parts thereof and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A receiver including a temperature controlled crystal oscillator having an input for an analog voltage tuning signal, first means for generating an analog temperature compensating control signal, second means for producing an analog automatic frequency control signal, means for continuously summing the analog temperature compensating and automatic frequency control signals and producing an analog sum signal, and current to voltage conversion means having an input for the analog sum signal and an output coupled to said input of the oscillator.

2. A receiver as claimed in claim 1, wherein the current to voltage conversion means comprises a single op-amp having a fixed gain.

3. A receiver as claimed in claim 2, further comprising gain setting means for selecting a desired temperature compensating characteristic of the temperature controlled crystal oscillator, and wherein said means for continuously summing sums the analog temperature compensating, the automatic frequency control and the desired temperature compensating characteristic signals in producing the analog sum signal.

4. A receiver as claimed in claim 1, further comprising switching means at the output of the current to voltage conversion means and voltage storing means coupled between the switching means and said input to the oscillator for storing the output voltage of said voltage conversion means whenever the switching means is open to interrupt a conductive path to said input of the oscillator.

5. A receiver as claimed in claim 4, further comprising gain setting means for selecting a desired temperature compensating characteristic of the temperature controlled crystal oscillator, and wherein said means for continuously summing sums the analog temperature compensating, the automatic frequency control and the desired temperature compensating characteristic signals in producing the analog sum signal.

6. A receiver as claimed in claim 1, further comprising gain setting means for selecting a desired temperature compensating characteristic of the temperature controlled crystal oscillator, and wherein said means for continuously summing sums the analog temperature compensating, the automatic frequency control and the desired temperature compensating characteristic signals in producing the analog sum signal.

7. An integrated receiver comprising a frequency down conversion stage having a first input for a received signal, a second input for a local oscillator signal supplied by a temperature controlled crystal oscillator and an output for a down-converted signal, first means for generating an analog temperature compensating control signal, second means for producing an analog automatic frequency control signal, means for continuously summing the analog temperature compensating and automatic frequency control signals and producing an analog sum signal, and current to voltage conversion means having an input for the analog sum signal and an output coupled to an input of the oscillator for an analog tuning signal.

8. A receiver as claimed in claim 7, further comprising switching means coupled to the output of the current to voltage conversion means and voltage storing means coupled to the output of the switching means for maintaining a voltage on said input when said switching means is an open circuit.

9. A receiver as claimed in claim 8, wherein the current to voltage conversion means comprises an op-amp having a fixed gain and a bias current source is coupled to the op-amp for setting the gain of the op-amp.

10. A receiver as claimed in claim 9, wherein the oscillator is separate from the integrated receiver, non-integrated resistances are coupled to the second means, to the summing node and to the bias current source via respective pins, and said switching means is coupled to the voltage storing means via a pin.

11. A receiver as claimed in claim 10, further comprising gain setting means for selecting a desired temperature compensating characteristic of the temperature controlled crystal oscillator, and wherein said means for continuously summing sums the analog temperature compensating, the automatic frequency control and the desired temperature compensating characteristic signals in producing the analog sum signal.

12. A receiver as claimed in claim 9, further comprising gain setting means for selecting a desired temperature compensating characteristic of the temperature controlled crystal oscillator, and wherein said means for continuously summing sums the analog temperature compensating, the automatic frequency control and the desired temperature compensating characteristic signals in producing the analog sum signal.

13. A receiver as claimed in claim 8, further comprising gain setting means for selecting a desired temperature compensating characteristic of the temperature controlled crystal oscillator, and wherein said means for continuously summing sums the analog temperature compensating, the automatic frequency control and the desired temperature compensating characteristic signals in producing the analog sum signal.

14. A receiver as claimed in claim 7, further comprising gain setting means for selecting a desired temperature compensating characteristic of the temperature controlled crystal oscillator, and wherein said means for continuously summing sums the analog temperature compensating, the automatic frequency control and the desired temperature compensating characteristic signals in producing the analog sum signal.

* * * * *